United States Patent
Sugahara et al.

(10) Patent No.: US 7,116,574 B2
(45) Date of Patent: Oct. 3, 2006

(54) SEMICONDUCTOR MEMORY DEVICE

(75) Inventors: Takeshi Sugahara, Fujisawa (JP);
Yukihiro Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 110 days.

(21) Appl. No.: 10/916,524

(22) Filed: Aug. 12, 2004

(65) Prior Publication Data

US 2005/0201168 A1 Sep. 15, 2005

(30) Foreign Application Priority Data

Mar. 11, 2004 (JP) ............................ 2004-069253

(51) Int. Cl.
*G11C 11/00* (2006.01)

(52) U.S. Cl. .................. 365/156; 365/154; 365/190

(58) Field of Classification Search .................. None
See application file for complete search history.

(56) References Cited

U.S. PATENT DOCUMENTS

| | | | |
|---|---|---|---|
| 5,864,511 A * | 1/1999 | Sato | 365/203 |
| 6,504,784 B1 * | 1/2003 | Kokubo | 365/229 |
| 6,515,887 B1 * | 2/2003 | Fujimoto | 365/63 |
| 6,567,326 B1 * | 5/2003 | Nakazato et al. | 365/203 |
| 6,801,463 B1 * | 10/2004 | Khellah et al. | 365/203 |

* cited by examiner

*Primary Examiner*—Son Mai
(74) *Attorney, Agent, or Firm*—Oblon, Spivak, McClelland, Maier & Neustadt, P.C.

(57) ABSTRACT

A semiconductor memory device includes first and second bit lines, memory cells each including first and second storage nodes, which are connected through selecting transistors to the first and second bit lines, respectively, a pre-charge circuit configured to pre-charge the first and second bit lines to a predetermined potential so as to read data, a hold circuit configured to maintain a potential level of the first and second bit lines, a read circuit connected to the first bit line, and a leak circuit having one terminal connected to the second bit line and another terminal connected to a ground. The leak circuit allows a current to leak from the second bit line.

11 Claims, 7 Drawing Sheets

SEMICONDUCTOR MEMORY DEVICE

CROSS-REFERENCE TO RELATED APPLICATIONS

This application is based upon and claims the benefit of priority from prior Japanese Patent Application No. 2004-069253, filed Mar. 11, 2004, the entire contents of which are incorporated herein by reference.

BACKGROUND OF THE INVENTION

1. Field of the Invention

The present invention relates to a semiconductor memory device, more particularly to a static random access memory (SRAM).

2. Description of the Related Art

With the recent progress in the fine patterning technology and the demand for improved system performance, more and more semiconductor memory devices having large storage capacity and operating at high speed are developed. FIG. 8 is a circuit diagram illustrating an example of an SRAM.

Referring to FIG. 8, a plurality of memory cells MC are arranged in a column direction which a bit line extends to. The memory cells MC are divided into a plurality of sub-arrays, each including a predetermined number of memory cells MC. Word lines WL and a pair of local bit lines LBL and /LBL are provided for each sub-array. In each sub-array, the memory cells are connected to the local bit lines LBL and /LBL and the corresponding ones of the word lines WL. A write circuit and a pre-charge circuit are connected to the local bit lines LBL and /LBL. A pair of global bit lines WGBL and /WGBL used for writing are connected to the write circuit. Local bit line LBL is connected to the read circuit, which in turn is connected to global bit line RGBL used for reading.

In the SRAM having the above configuration, the read circuit is connected only to the local bit line LBL. This single-end read circuit is advantageous in that it helps reduce the number of global bit lines required. In general, if the capacitance load on the bit lines, which are due to the capacitance of memory cells and the wiring capacitance, increases, the read operation is inevitably low in speed. However, if the local bit lines are provided in layers as in the SRAM shown in FIG. 8, the capacitance load on the bit lines can be reduced.

To access the SRAM, word lines are activated. In general, the pre-charging operation is stopped for the local bit lines of the sub-arrays for which the pre-charging operation is performed until then and which includes the activated word lines. This selective pre-charging operation is accomplished by selecting areas of the corresponding sub-arrays on the basis of address signals entered for the activation of the word lines.

In practice, however, there may be a case where this area selection cannot be performed. Also, there may be a case where signals for selecting the areas are too slow for the SRAM to wait for. An example of an apparatus where this problem occurs is a translation lookaside buffer (TLB) wherein a content address memory (CAM) and an SRAM are connected together. The CAM and the SRAM are connected together by means of a plurality of matching lines. In the TLB, word lines WL are selected by activation signals which the CAM generates on the basis of address signals. Signals used for selecting areas must be generated by use of the matching lines. Therefore, the area selection signals are generated after the activation signals used for selecting word lines are generated. In other words, the SRAM cannot operate until the area selection signals are generated or determined. As a result, a long time is required before data is output.

To solve this problem, it may be thought not to perform the pre-charging operation for all local bit lines for which the pre-charging operation is performed until then, irrespective of whether there are word lines that are activated. If this measure is taken, the local bit lines of the areas where the word lines are not activated, are set in the so-called "floating high state." The floating high state is a state where power source voltage Vcc first applied, raising the potential level to high, and then the application of the power source voltage Vcc stops. If this phenomenon occurs, leak current increases especially in miniaturized transistors. In addition, the leak current from a local bit line may increase if many transistors (which are likely to be leak current sources) are connected to that local bit line. If the leak current is too large in amount, a high potential level cannot be maintained in the floating high state, and the potential level of the local bit lines drops to low, resulting in a malfunction or an undesirable phenomenon.

To prevent this malfunction or undesirable phenomenon, it is thought to add a P-type MOS transistor and connect this transistor to the local bit lines to maintain a high potential state. FIG. 9 is a circuit diagram illustrating an example of a circuit to which such a P-type MOS transistor is added. However, an SRAM having this configuration does not function well because the addition of the P-type MOS transistor conflicts with the operation of reading memory cells at low level. As a result, the read operation will be slow.

As a relevant technology, Jpn. Pat. Appln. KOKAI Publication No. 4-167295 discloses how to prevent read data from becoming indefinite when an address signal does not select any of the word lines.

BRIEF SUMMARY OF THE INVENTION

A semiconductor memory device according to the first aspect of the present invention comprises: a first bit line and a second bit line; memory cells each including first and second storage nodes, which are connected through selecting transistors to the first and second bit lines, respectively; a pre-charge circuit configured to pre-charge the first and second bit lines to a predetermined potential so as to read data; a hold circuit configured to maintain a potential level of the first and second bit lines; a read circuit connected to the first bit line; and a leak circuit having one terminal connected to the second bit line and another terminal connected to a ground, the leak circuit allowing a current to leak from the second bit line.

A semiconductor memory device according to the second aspect of the present invention comprises: a first bit line and a second bit line; memory cells each including first and second storage nodes, which are connected through selecting transistors to the first and second bit lines, respectively; a leak circuit, connected between the first storage node and the second bit line, for allowing a current to leak from the second bit line; a hold circuit configured to maintain a predetermined potential level of the first and second bit lines; and read circuit connected to the first bit line.

A semiconductor memory device according to the third aspect of the present invention comprises: a first bit line and a second bit line; first memory cells connected to both the first and second bit lines; a first read circuit connected to the first bit line; a third bit line and a fourth bit line; second memory cells connected to both the third and fourth bit lines; a second read circuit connected to the third bit line; and a first hold circuit configured to maintain a high potential level of the first bit line when the first memory cells are in a non-selected state.

DETAILED DESCRIPTION OF THE INVENTION

Figure 1:
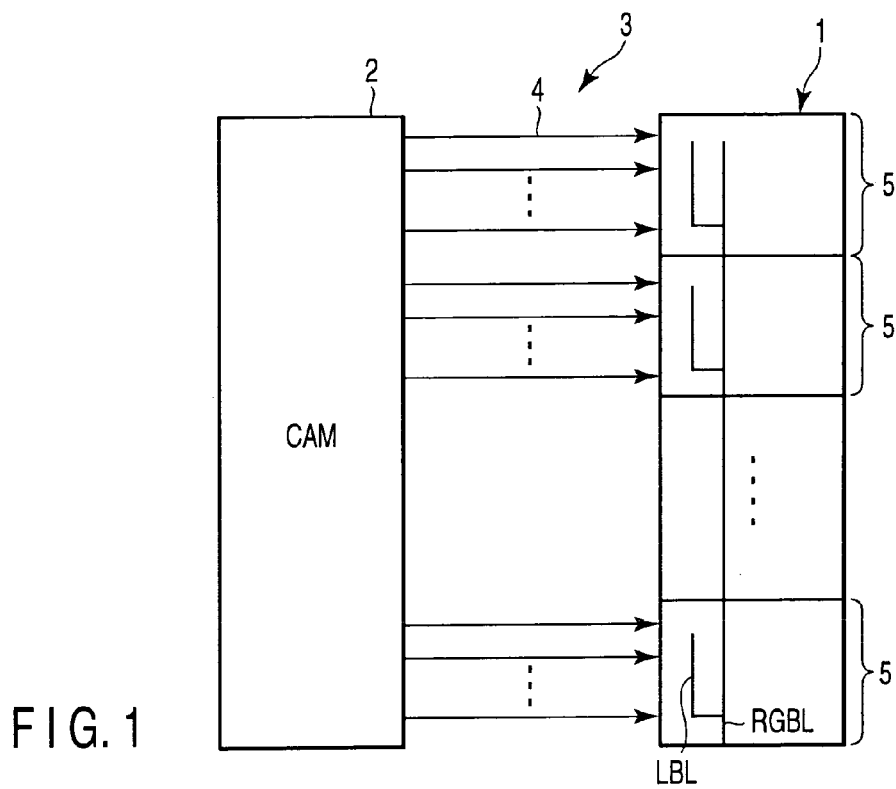
FIG. 1 is an overall view of an example of TLB 3 incorporating an SRAM 1 according to the first embodiment of the present invention.

Embodiments of the present invention, which were conceived in consideration of the problems of the conventional art, will now be described with reference to the accompanying drawings. In the descriptions below, the same reference numerals will be used to denote corresponding or similar structural components, and repetitive reference to such structural components will be made only where necessary.

FIRST EMBODIMENT

FIG. 1 is an overall view of an example of TLB 3 incorporating an SRAM 1 according to the first embodiment of the present invention.

TLB 3 comprises a CAM 2, an SRAM 1, and match lines 4 connecting the CAM 2 and the SRAM 1 together. The SRAM 1 includes a plurality of sub-arrays 5, the detailed configuration of which will be described later. Each sub-array 5 includes a local bit line LBL. The SRAM 1 is provided with a data-reading global bit line RGBL used in common. The local bit lines LBL are connected to the data-reading global bit line. In other words, the SRAM 1 has a multi-layered structure.

The CAM 2 activates some of the match lines 4 based on an address signal input from an external circuit. Thus, the word lines corresponding to the activated match lines 4 are activated. The CAM 2 also generates an area selection signal indicating which area or areas contain the activated sub-arrays 5. The area selection signal is generated based on a combination of the match lines 4.

Figure 2:
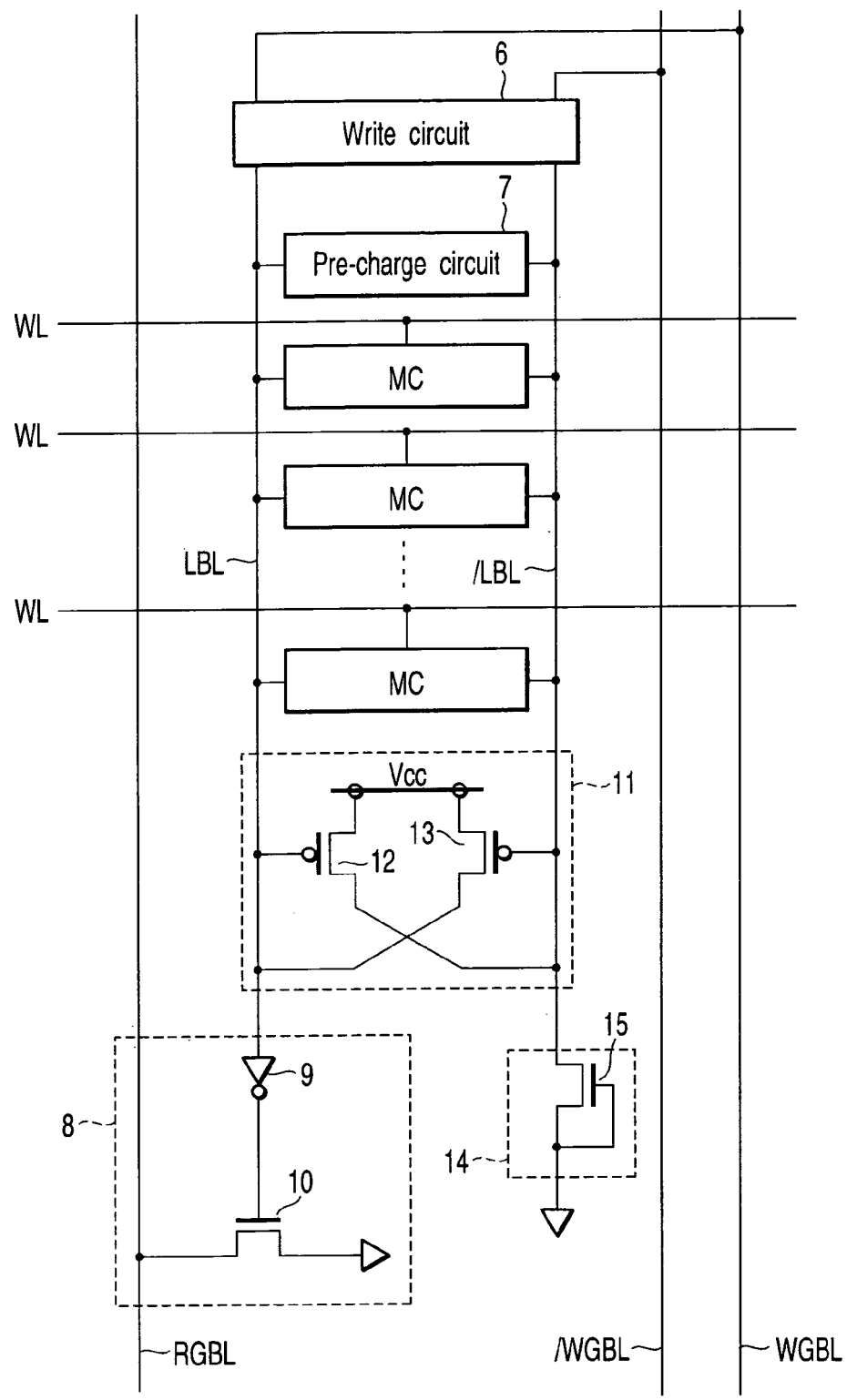
FIG. 2 is a circuit diagram of a sub-array 5 included in the SRAM 1 shown in FIG. 1.

FIG. 2 is a circuit diagram of a sub-array 5 included in the SRAM 1 shown in FIG. 1.

A plurality of memory cells MC are arranged in the column direction. The sub-array 5 is provided with word lines WL and a pair of local bit lines LBL and /LBL. In the sub-array 5, the memory cells MC are connected to the local bit lines LBL and /LBL and corresponding ones of the word lines WL. A write circuit 6 and a pre-charge circuit 7 are connected to the local bit lines LBL and /LBL. A pair of global bit lines WGBL and /WGBL for writing data are connected to the write circuit 6. A read circuit 8 is connected to local bit line LBL. The read circuit 8 is also connected to the data-reading global bit line RGBL.

The read circuit 8 includes an inverter 9 and an N-type MOS transistor (hereinafter referred to as "NMOS transistor") 10. The inverter 9 has an input terminal connected to local bit line LBL and an output terminal connected to the gate of the NMOS transistor 10. The drain of this NMOS transistor 10 is connected to the data-reading global bit line RGBL, and the source thereof is connected to a grounded voltage point. It should be noted that the read circuit shown in FIG. 2 is only an example and is not limited to this configuration.

A potential level hold circuit 11 is connected between the local bit lines LBL and /LBL. The potential level hold circuit 11 includes two P-type MOS transistors (hereinafter referred to as "PMOS transistors") 12 and 13. PMOS transistor 12 has its gate connected to local bit line LBL, its source to power supply Vcc, and its drain to local bit line /LBL. PMOS transistor 13 has its gate connected to local bit line /LBL, its source to power supply Vcc, and its drain to local bit line LBL. It should be noted that the potential level hold circuit 11 shown in FIG. 2 is only an example and is not limited to this configuration.

A leak circuit 14 is connected between local bit line /LBL and a grounded potential point. The leak circuit 14 includes an NMOS transistor 15. The NMOS transistor 15 has its drain connected to local bit line /LBL and its source to the grounded potential point. The gate of the NMOS transistor 15 is connected to the grounded potential point. It should be noted that the leak circuit 14 is not limited to this configuration and may be realized by use of a resistor or a diode.

Figure 3:
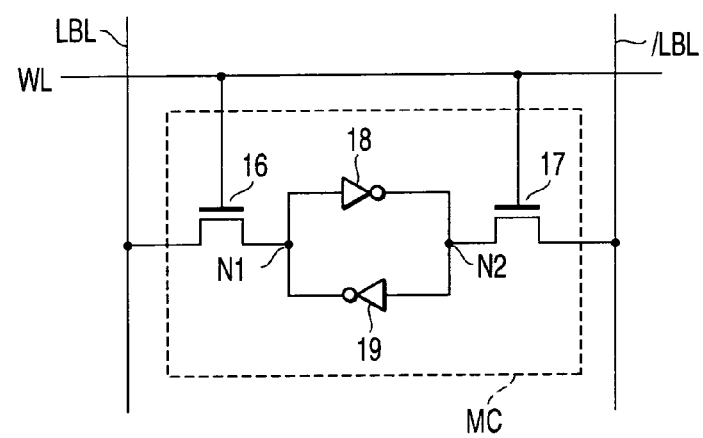
FIG. 3 is a circuit diagram of a memory cell MC shown in FIG. 2.

FIG. 3 is a circuit diagram of a memory cell MC shown in FIG. 2.

The memory cell MC includes NMOS transistors 16 and 17 and inverters 18 and 19. Each of the inverters 18 and 19 has its input terminal connected to the output terminal of the other inverter. With this configuration, the memory cell MC has two storage nodes N1 and N2. The gates of the NMOS transistors 16 and 17 are connected to word line WL. NMOS transistor 16 has its drain connected to local bit line LBL, and its source connected to storage node N1. On the other hand, NMOS transistor 17 has its drain connected to local bit line /LBL and its source connected to storage node N2.

A description will be given as to how the SRAM 1 having the above configuration operates.

First of all, a pre-charging operation will be described. Prior to the read or write operation, the pre-charge circuit 7 pre-charges the local bit lines LBL and /LBL to set them at the power supply potential (the local bit lines LBL and /LBL are set at the high potential level). After the word lines of the sub-array 5 are activated, the pre-charge circuit 7 stops the pre-charging operation. As a result, the read operation and the write operation are enabled. The pre-charging operation is stopped by using, for example, the area selection signal described above.

The write operation will be described. When the word lines WL are activated, the write circuit 6 transfers complementary data from data-writing global bit lines WGBL and /WGBL to local bit lines LBL and /LBL, respectively. As a result, the potential of one of the local bit lines drops to low level, with the potential of the other local bit line kept at high level. Hence, the data are written in the memory cells MC connected to the activated word lines WL.

Next, the read operation will be described. When the word lines WL are activated, the data recorded in the memory cells MC are moved to local bit lines LBL and /LBL. The read circuit 8 detects the potential of local bit line LBL, and the result of this detection is sent to the data-reading global bit line RGBL. For example, if the local bit line LBL is at low level, NMOS transistor 10 is turned on, thereby permitting the data-reading global bit line RGBL to have the grounded potential level (i.e., low potential level).

At the time, the local bit line which is in the floating high state is kept at high level by the potential level hold circuit 11. Complementary data are present on the local bit lines LBL and /LBL. When the potential of local bit line /LBL drops to low level, PMOS transistor 13 is turned on, and local bit line LBL is thus kept at high potential level. When the potential of local bit line LBL drops to low level, PMOS transistor 12 is turned on, and local bit line /LBL is thus kept at high potential level. The potential level hold circuit 11 operates in a similar manner in the write operation mode as well. If the write circuit 6 or read circuit 8 incorporates the potential level hold circuit 11, it is not necessary to provide an independent potential level hold circuit as in the embodiment described above.

A description will be given as to how the leak circuit 14 operates.

(1) Where Pre-charge is Active and Word Lines Are Not Activated

In this case, a pre-charge state is created, and the pre-charge circuit 7 charges local bit lines LBL and /LBL to set them at a high potential level. At the time, local bit line pairs LBL and /LBL are not set in the floating high state. Although the additional use of the leak circuit 14 may result in an increase in the amount of leak current flowing to a grounded potential point, the driving operation the pre-charge circuit 7 performs has stronger effects, and local bit line /LBL maintains high level. PMOS transistors 12 and 13 are in the OFF state since their gate potentials are at a high potential level. Even if local bit line /BL fails to maintain a high potential level due to the increase in the amount of leak current from the leak circuit 14, PMOS transistor 13 is turned on, maintaining the high level state of local bit line LBL. Hence, the SRAM 1 does not malfunction.

(2) Where Pre-charge is Inactive and Word Lines Are Activated

In this case, the SRAM 1 performs a write operation or a read operation. In the case of the write operation, the write circuit 6 outputs write data to local bit lines LBL and /LBL. At the time, local bit lines LBL and /LBL are not in the floating state. Although the use of the leak circuit 14 increases the amount of leak current flowing to a grounded potential point, the driving operation the write circuit 6 performs has stronger effects, and local bit line /LBL maintains a data write potential. Because of the presence of the write data, the gate potential of one of PMOS transistors 12 and 13 becomes low, and the local bit line corresponding to the other PMOS transistor is set at high potential level (i.e., a cross couple operation is performed).

In the case of the read operation, the storage data in the memory cell MC moves to local bit lines LBL and /LBL. Because of the cross couple operation of the potential level hold circuit 11, local bit lines LBL and /LBL are not in the floating state. The use of the leak circuit 14 increases the amount of leak current flowing to a grounded potential point. In the case of the read operation, the local bit lines of memory cell MC are not driven intensively. Therefore, the total amount of leak current flowing from local bit line /BL in the state where the leak circuit 14 is additionally provided, should be set at a value less than the driving current the memory cell MC uses for driving local bit line /LBL to low level.

To be more specific, the total amount of leak current, which is a sum total of: (i) leak current leaking from local bit line /BL to each memory cell MC when the storage nodes N2 of all memory cells MC of a sub-array 5 are at low potential level and (ii) leak current leaking from the leak circuit 14 to a grounded potential point, has to be smaller than the amount of drive current which one memory cell MC uses for driving local bit line LBL to a low potential level.

This will be explained using a formula. Let us assume that: the number of memory cells MC included in a sub-array 5 is $m$; the leak current leaking from local bit line /LBL to one memory cell when local bit line /LBL is in the floating high state, the memory cells are MC are in the non-selective state and the storage nodes N2 are at low level, is Imcleak; the drive current which one memory cell MC uses for driving local bit line LBL to set it at low level is Ildr; and the leak current leaking from the leak circuit 14 to a grounded potential point when local bit line /LBL is in the floating high state is Ileak. In this case, leak current Ileak satisfies the following relationship:

$$(\text{Imcleak} \times m) + \text{Ileak} < \text{Ildr}$$

If Ileak is fixed in this formula, it is possible to calculate the number $m$ of memory cells MC that are connectable to local bit lines LBL and /LBL.

As can be seen from the above, local bit line LBL can be kept in the read state, and there is substantially no delay in the read time.

(3) Where Pre-charge is Inactive and Word Lines Are Not Activated

To enable a high-speed operation, the read circuit 8 shown in FIG. 2 transmits a low level potential to global bit line RGBL as soon as the potential level of local bit line LBL becomes low. In the inactive state (i.e., the state where the pre-charge is inactive and the word lines are not activated), the sub-array 5 must reliably keep local bit line LBL at high level. Since the pre-charge is inactive and the word lines are not activated, local bit lines LBL and /LBL are in the floating high state. Since, in this case, current leaks from local bit lines LBL and /LBL to memory cells MC or to a grounded potential point, the potential level of local bit lines LBL and /LBL gradually decreases.

To prevent the SRAM 1 from malfunctioning, local bit line LBL (i.e., the local bit line connected to the read circuit 8) has to maintain high level. That is, the leak current from local bit line /LBL is controlled to be larger in amount than the leak current from local bit line LBL. In other words, when the amount of leak current leaking from local bit line LBL is largest (in which state, all storage nodes N1 of memory cells MC are at low level), the leak circuit 14 is so set as to make the leak current from local bit line /LBL larger in amount than the leak current from local bit line LBL.

By setting the leak circuit 14 in this manner, local bit line /LBL becomes low in potential level before local bit line LBL does. Because of the cross couple operation of the potential level hold circuit 11, local bit line LBL switches from the floating high level to a reliably high level. Hence, the low-level data is not output from the non-selected sub-arrays 5, and the SRAM 1 is thus prevented from malfunctioning.

If current leaks from the local bit lines provided for circuits other than the circuits of the memory cells MC, the leak current of the leak circuit 14 is controlled in consideration of such leak current. Where the leak circuit 14 is made of an MOS transistor as in the present embodiment, the amount of leak current is controlled by changing the size (gate width W) of the MOS transistor.

As detailed in the above, the SRAM 1 has a multi-layered structure, and the read circuit 8 of the sub-array 5 of each layer is made of a single-end type, and the potential level hold circuit 11 is connected to local bit lines LBL and /LBL of sub-array 5. The leak circuit 14 is connected to the local bit lines that is not connected to the read circuit 8, so as to permit leak current from that local bit line to flow to a grounded potential point.

The first embodiment is advantageous in that the current leaking from memory cells MC does not give rise to a malfunction and the data reading speed is not adversely affected. The first embodiment can cope with the leak current problem even when more miniaturized memory cells are used in the future.

In addition, the first embodiment prevents the SRAM 1 from malfunctioning even if the local bit lines and the word lines are in any state (active, inactive, activated or non-activated state).

SECOND EMBODIMENT

In the second embodiment, the SRAM 1 is configured to pre-discharge local bit lines LBL and /LBL before the read and write operations are performed.

Figure 4:
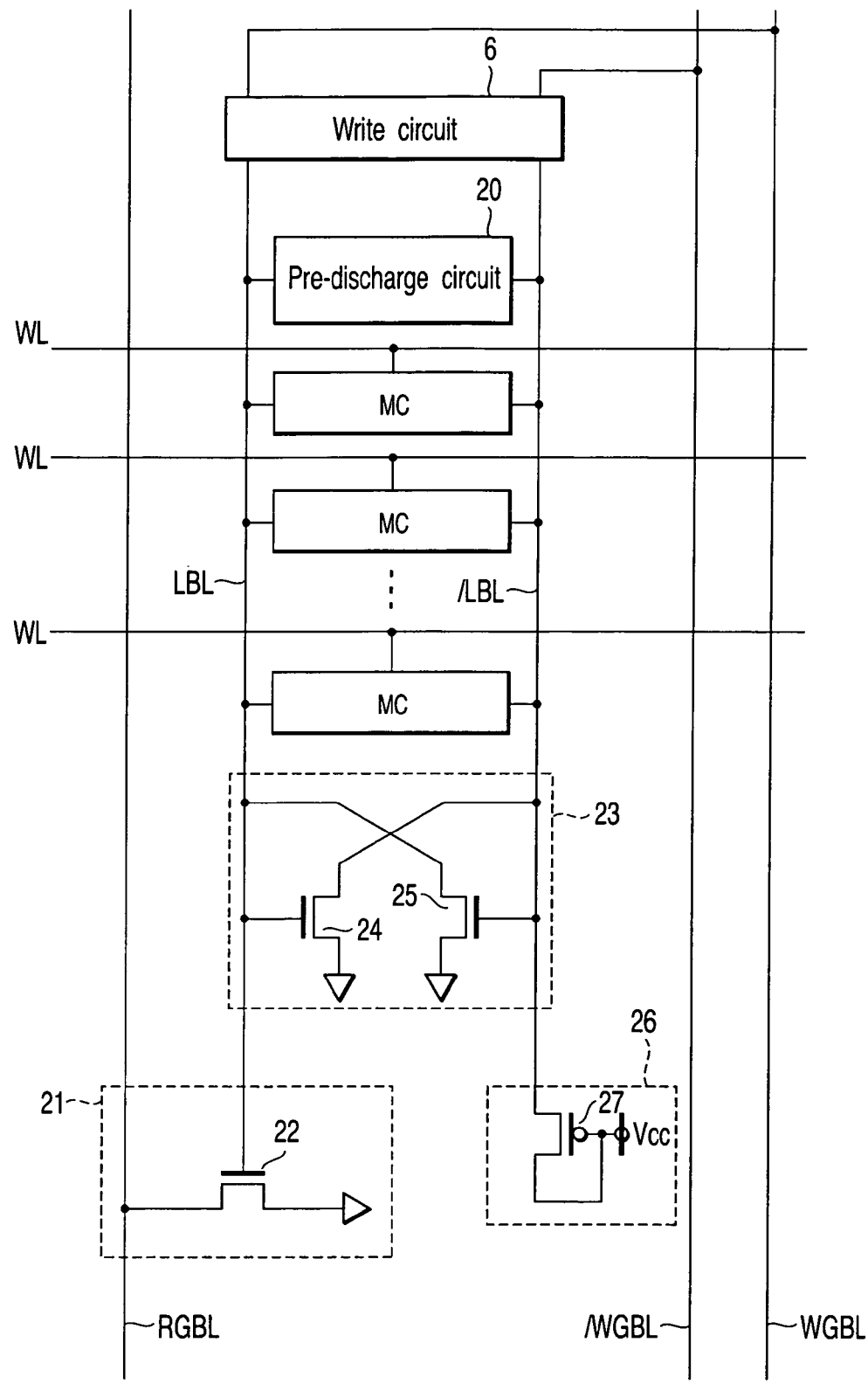
FIG. 4 is a circuit diagram of a sub-array 5 included in an SRAM 1 according to the second embodiment of the present invention.

FIG. 4 is a circuit diagram of a sub-array 5 included in an SRAM 1 according to the second embodiment of the present invention.

A pre-discharge circuit 20 is connected to a pair of local bit lines LBL and /LBL. Before the read and write operations, the pre-discharge circuit 20 pre-discharges the local bit lines LBL and /LBL to set them at the grounded potential level (i.e., low level). When word lines WL of the sub-array 5 are activated, the pre-discharge circuit 20 stops the discharging operation. As a result, the read and write operation are enabled.

A read circuit 21 is connected to local bit line LBL. The read circuit 21 is also connected to data-reading global bit line RGBL. The read circuit includes an NMOS transistor 22. The NMOS transistor 22 has a gate connected to local bit line LBL, a drain connected to data-reading global bit line RGBL, and a source connected to a grounded voltage point. It should be noted that the read circuit 21 shown in FIG. 4 is only an example and is not limited to this configuration.

A potential level hold circuit 23 is connected between the local bit lines LBL and /LBL. The potential level hold circuit 23 includes two NMOS transistors 24 and 25. The NMOS transistor 24 has its gate connected to local bit line LBL, its source to a grounded potential point, and its drain to local bit line /LBL. The NMOS transistor 25 has its gate connected to local bit line /LBL, its source to a grounded potential point, and its drain to local bit line LBL. It should be noted that the potential level hold circuit 23 shown in FIG. 4 is only an example and is not limited to this configuration.

A leak circuit 26 is connected between local bit line /LBL and power supply source Vcc. The leak circuit 26 includes a PMOS transistor 27. The PMOS transistor 27 has its drain connected to local bit line /LBL, its source to power supply source Vcc, and its gate to power supply source Vcc. It should be noted that the leak circuit 26 is not limited to this configuration and may be realized by use of a resistor or a diode.

Figure 5:
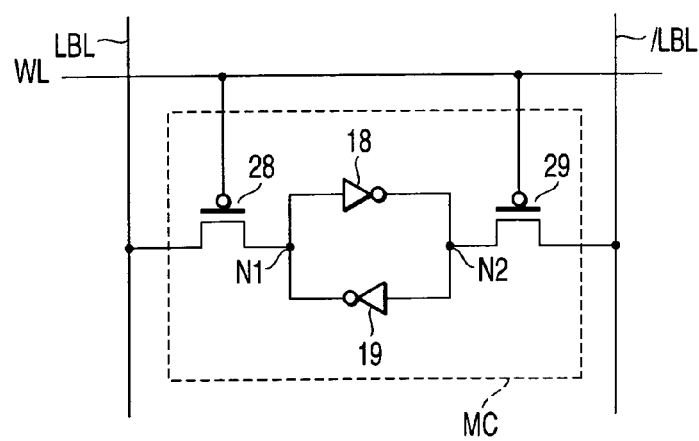
FIG. 5 is a circuit diagram of a memory cell MC shown in FIG. 4.

FIG. 5 is a circuit diagram of a memory cell MC shown in FIG. 4.

The memory cell MC includes PMOS transistors 28 and 29 and inverters 18 and 19. Each of the inverters 18 and 19 has its input terminal connected to the output terminal of the other inverter. With this configuration, the memory cell MC has two storage nodes N1 and N2. The gates of the PMOS transistors 28 and 29 are connected to word line WL. PMOS transistor 28 has its drain connected to local bit line LBL, and its source connected to storage node N1. On the other hand, NMOS transistor 29 has its drain connected to local bit line /LBL and its source connected to storage node N2.

The SRAM 1 having the above configuration differs from the SRAM 1 of the first embodiment in that it performs the pre-discharging operation instead of the pre-charging operation of the first embodiment. The advantages of the SARAM 1 of the second embodiment are similar to those of the first embodiment.

As can be seen from this, the present invention is applicable also to the SRAM 1 that performs the pre-discharging operation.

THIRD EMBODIMENT

In the SRAM 1 of the third embodiment, each memory cell MC includes a leak circuit.

Figure 6:
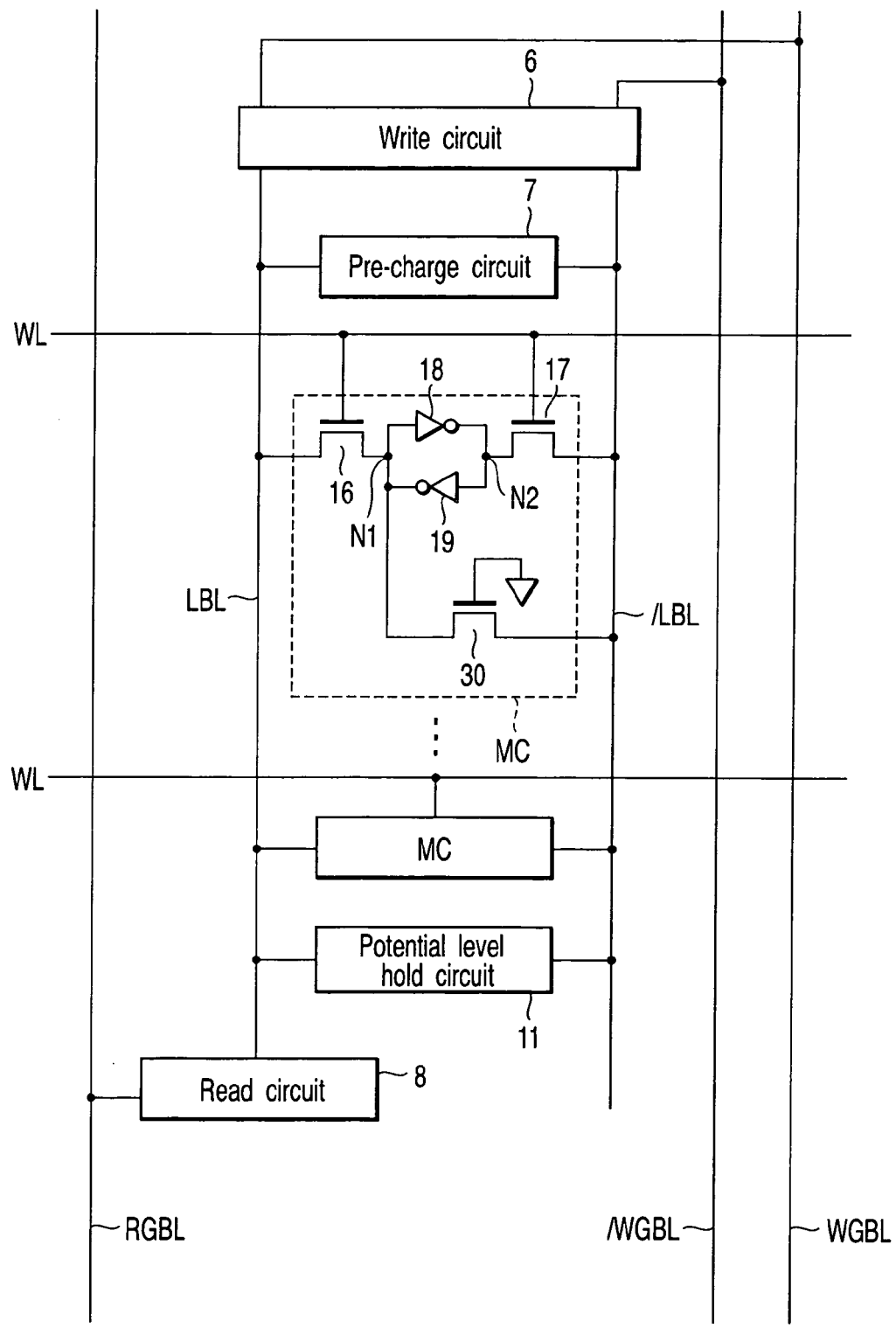
FIG. 6 is a circuit diagram of a sub-array 5 included in an SRAM 1 according to the third embodiment of the present invention.

FIG. 6 is a circuit diagram of a sub-array 5 included in the SRAM 1 of the third embodiment of the present invention.

The memory cell MC shown in FIG. 6 includes an NOMS transistor 30 serving as a leak circuit. The NMOS transistor 30 has its gate connected to a grounded potential point, its source to a storage node N1, and its drain connected to local bit line /LBL. A sub-array 5 includes a plurality of memory cells MC each having this configuration. The memory cells MC are arranged in the column direction.

A description will be given as to how the sub-array 5 having this configuration operates.

Let us assume that the sub-array 5 is in the inactive state (i.e., the state where the pre-charge is inactive and the word lines are not activated). In this state, the sub-array 5 must reliably keep local bit line LBL at high level. Since the pre-charge is inactive and the word lines are not activated, local bit lines LBL and /LBL are in the floating high state. Since, in this case, current leaks from local bit lines LBL and /LBL to memory cells MC, the potential levels of local bit lines LBL and /LBL gradually decrease.

To prevent the SRAM 1 from malfunctioning, local bit line LBL (i.e., the local bit line connected to the read circuit 8) has only to maintain high level. Where leak current flows from local bit line LBL to memory cell MC (in which case, local bit line LBL is in the floating high state, and the storage node N1 is at low level), leak current also flows from local bit line /LBL to memory cell MC by way of NMOS transistor 30. In other words, leak current flows from local bit line /LBL not only when storage nodes N2 of memory cells MC are at low level but also when storage nodes N1 of memory cells MC are at low level.

Since memory cell MC includes NMOS transistor 30 as described above, local bit line /LBL becomes low in potential level before local bit line LBL does. Because of the cross couple operation of the potential level hold circuit 11, local bit line LBL switches from the floating high level to a reliably high level. Hence, the low-level data is not output from the non-selected sub-arrays 5, and the SRAM 1 is thus prevented from malfunctioning.

The size of NMOS transistor 30 is set larger than that of NOMS transistor 16 (in other words, the gate width W of NMOS transistor 30 is greater than that of NOMS transistor 16). With this configuration, NOMS transistor 30 undergoes more leak current than NOMS transistor 16 does. Therefore, even when the storage nodes 1 of all memory cells MC are at low level and nodes 2 of all memory cells MC are at high level, the potential level of local bit line /LBL decreases to low before the potential level of local bit line LBL does.

Where NOMS transistor 30 and NMOS transistor 16 are the same in size (where they have the same gate width W), it is preferable to add the leak circuit 14 described in connection with the first embodiment. With this configuration, the potential level of local bit /line LBL decreases to low before the potential level of local bit line LBL does without reference to the storage data in memory cell.

In the states other than the above-described state (the state where the pre-charge is inactive and the word lines are not activated), the sub-array 5 of the third embodiment operates in a similar manner to that of the case where each memory cell MC does not include NMOS transistor 30.

As can be seen from the above, the third embodiment is advantageous in that the current leaking from memory cells MC does not give rise to a malfunction and the data reading speed is not adversely affected. The third embodiment can cope with the leak current problem even when more miniaturized memory cells are used in the future.

In addition, the third embodiment prevents the SRAM 1 from malfunctioning even if the local bit lines and the word lines are in any state (active, inactive, activated or non-activated state).

The leak circuit for allowing leak current from leaking from local bit line /LBL is not limited to NMOS transistor 30 described above; it may be realized by use of a resistor or a diode.

FOURTH EMBODIMENT

Figure 7:
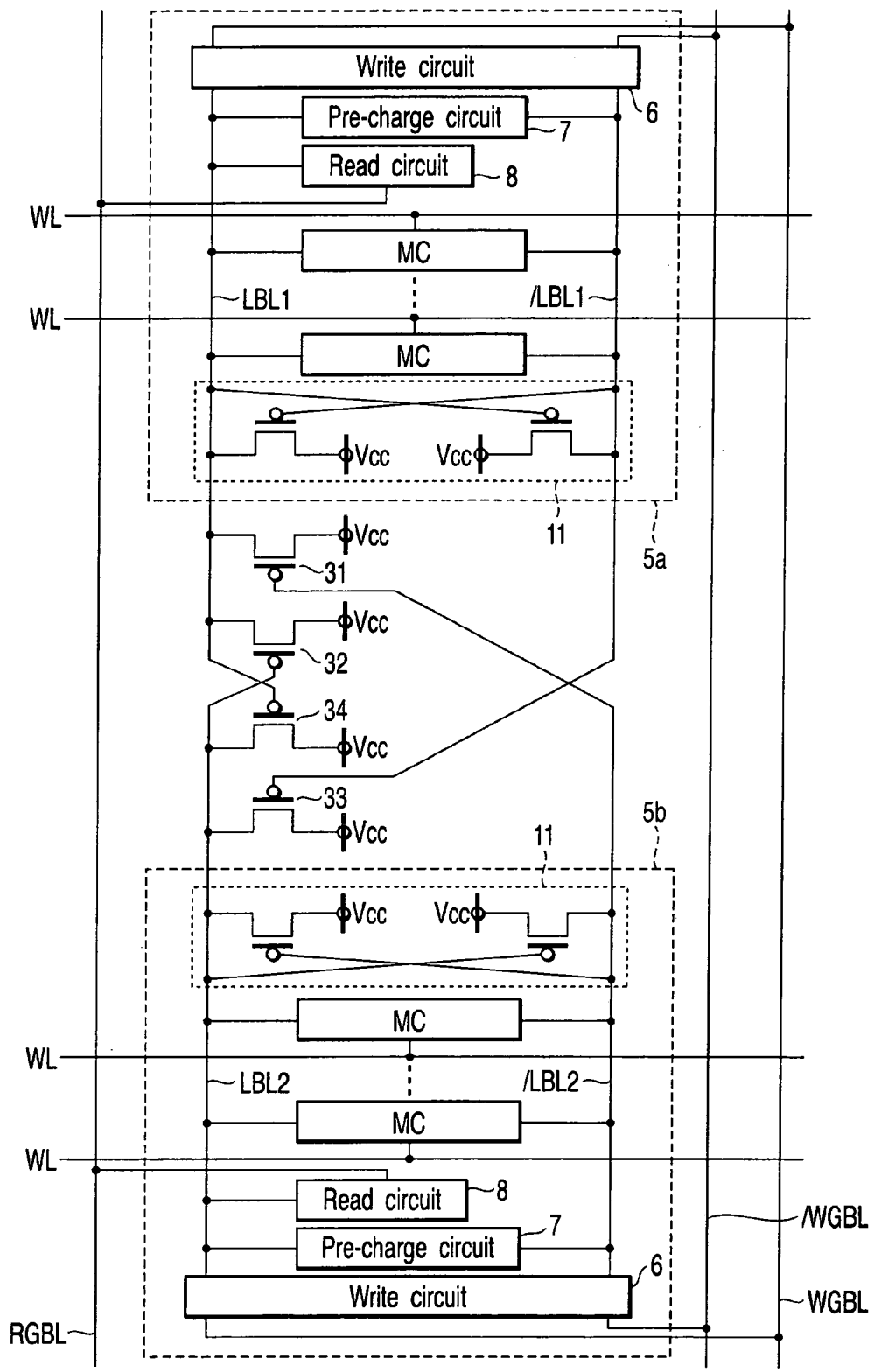
FIG. 7 is a circuit diagram illustrating the major portion of an SRAM 1 according to the fourth embodiment of the present invention.
Figure 8:
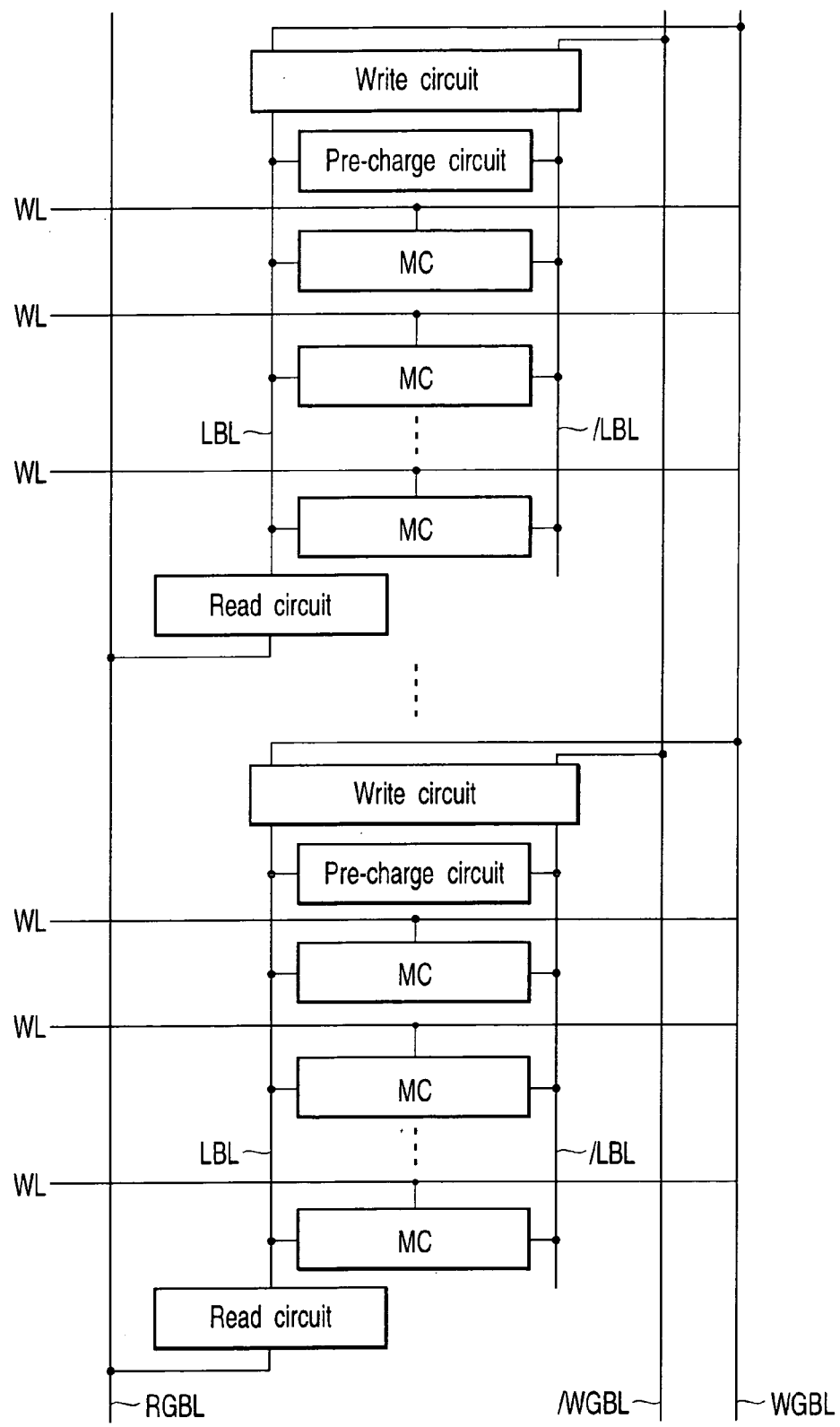
FIG. 8 is a circuit diagram showing an example of an SRAM.
Figure 9:
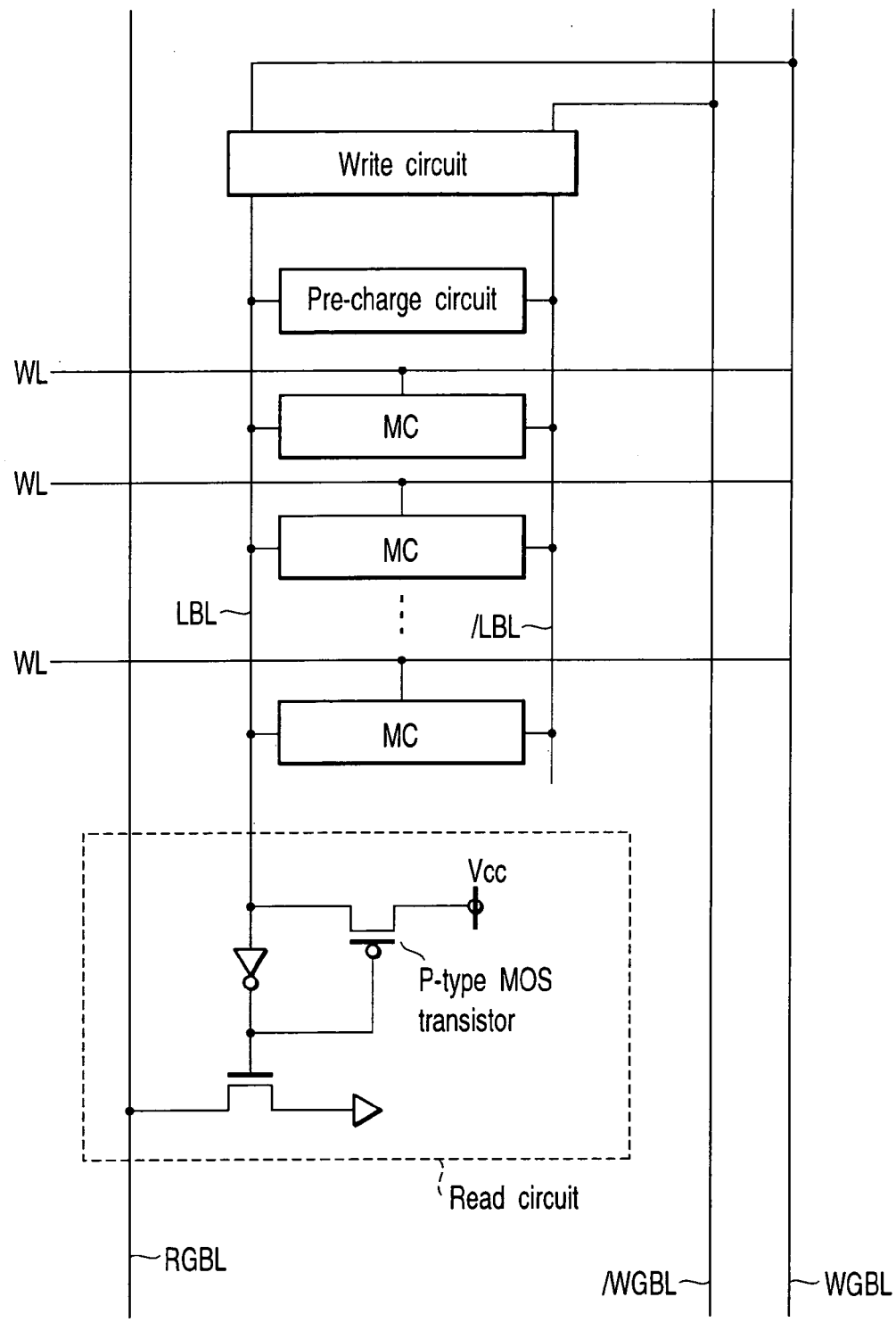
FIG. 9 is a circuit diagram showing an example of an SRAM that additionally employs a P-type MOS transistor for maintaining a high potential level.

FIG. 7 is a circuit diagram illustrating the major portion of the SRAM 1 of the fourth embodiment of the present invention.

The SRAM 1 comprises two sub-arrays 5a and 5b. Sub-array 5a includes a pair of local bit lines LBL1 and /LBL1. Likewise, sub-array 5b includes a pair of local bit lines LBL2 and /LBL2. Each of the MCs included in the sub-arrays 5a and 5b has the same configuration as that described in connection with the first embodiment. The local bit lines of sub-array 5a and the local bit lines of sub-array 5b are connected together by means of four PMOS transistors 31–34.

More specifically, PMOS transistor 31 has its gate connected to local bit line /LBL2, its source connected to power supply source Vcc, and its drain to local bit line LBL1. PMOS transistor 32 has its gate connected to local bit line LBL2, its source connected to power supply source Vcc, and its drain to local bit line LBL1. PMOS transistor 33 has its gate connected to local bit line /LBL1, its source connected to power supply source Vcc, and its drain to local bit line LBL2. PMOS transistor 34 has its gate connected to local bit line LBL1, its source connected to power supply source Vcc, and its drain to local bit line LBL2.

A description will be given as to how the SRAM 1 having the above configuration operates. Since the read circuit which the fourth embodiment employs is a single end type, the potential of the local bit line which is one of local bit lines LBL1 and LBL2 and which corresponds to non-activated word lines is kept at high level.

Each of the sub-arrays 5a and 5b includes a potential level hold circuit 11. When one of the local bit lines drops to low level, each sub-array keeps the other local bit lines at high level.

When the potential level of local bit line LBL2 becomes low, PMOS transistor 32 keeps local bit line LBL1 at high level. When the potential level of local bit line /LBL2 becomes low, PMOS transistor 31 keeps local bit line LBL1 at high level. Likewise, when the potential level of local bit line LBL1 becomes low, PMOS transistor 34 keeps local bit line LBL2 at high level. When the potential level of local bit line /LBL1 becomes low, PMOS transistor 33 keeps local bit line LBL1 at high level.

As detailed above, the fourth embodiment can maintain a high potential level with respect to the local bit lines of the sub-array whose word lines are not activated. In the floating high state of the local bit lines, leak current does not give rise to a malfunction of the SRAM 1.

In addition, no complicated control circuit is required, and the SRAM 1 is prevented from malfunctioning by use of a simple-configuration and low-price circuit.

In the case of an SRAM which does not comprise the potential level hold circuit 11, what is required is to add PMOS transistor 13. In this case as well, the advantages of the present invention are attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a first bit line and a second bit line;
    memory cells each including first and second storage nodes, which are connected through selecting transistors to the first and second bit lines, respectively;
    a pre-charge circuit configured to pre-charge the first and second bit lines to a predetermined potential so as to read data;
    a hold circuit configured to maintain a potential level of the first and second bit lines;
    a read circuit connected to the first bit line; and
    a leak circuit having one terminal connected to the second bit line and another terminal connected to a ground, said leak circuit allowing a current to leak from the second bit line.

2. The semiconductor memory device according to claim 1, wherein said pre-charge circuit charges the first and second bit lines to a high potential level, and when one of the first and second bit lines becomes low in potential level, said hold circuit keeps another one of the first and second bit lines in a high level state.

3. The semiconductor memory device according to claim 2, wherein said leak circuit allows a first leak current leaking from the second bit line to be larger in amount than a second leak current leaking from the first bit line.

4. The semiconductor memory device according to claim 3, wherein when said memory cells are in a non-selected state and said first and second bit lines are in a non pre-charged state, said leak current controls the first leak current to be larger in amount than the second leak current, said first leak current leaking from the second bit line to both the memory cells and the ground, and said second leak current leaking from the first bit line to the memory cells.

5. The semiconductor memory device according to claim 2, wherein said leak circuit allows a first leak current leaking from the second bit line to be smaller in amount than a first drive current which the memory cells use for driving the first bit line to low level.

6. The semiconductor memory device according to claim 5, wherein when said memory cells are in a selected state and said first and second bit lines are in a non pre-charged state, said leak current controls the first leak current to be smaller in amount than the first drive current, said first leak current leaking from the second bit line to both the memory cells and the ground.

7. The semiconductor memory device according to claim 2, wherein said hold circuit includes a first P-type MOS transistor and a second P-type MOS transistor, said first P-type MOS transistor having a gate connected to the second bit line, a source connected to a power supply source, and a drain connected to the first bit line, and said second P-type MOS transistor having a gate connected to the first bit line, a source connected to the power supply source, and a drain connected to the second bit line.

8. The semiconductor memory device according to claim 2, wherein said read circuit includes an inverter circuit and a first N-type MOS transistor, said inverter circuit having an input section connected to the first bit line and an output section, and said first N-type MOS transistor having a gate connected to the output section of the inverter circuit, a source connected to the ground, and a drain from which read data is output.

9. The semiconductor memory device according to claim 2, wherein said leak circuit includes an N-type MOS transistor having a gate and source connected to the ground and a drain connected to the second bit line.

10. The semiconductor memory circuit according to claim 1, wherein said pre-charge circuit charges the first and second bit lines to a low potential level, and when one of the first and second bit lines becomes high in potential level, said hold circuit keeps another one of the first and second bit lines in a low level state.

11. The semiconductor memory circuit according to claim 10, wherein said leak circuit includes a P-type MOS transistor having a gate and source connected to the power supply source and a drain connected to the second bit line.

* * * * *